United States Patent
Schuster

(10) Patent No.: US 6,169,627 B1
(45) Date of Patent: Jan. 2, 2001

(54) CATADIOPTRIC MICROLITHOGRAPHIC REDUCTION OBJECTIVE

(75) Inventor: Karl Heinz Schuster, Königsbronn (DE)

(73) Assignee: Carl-Zeiss-Stiftung, Heidenheim (DE)

( * ) Notice: Under 35 U.S.C. 154(b), the term of this patent shall be extended for 0 days.

(21) Appl. No.: 09/263,788

(22) Filed: Mar. 5, 1999

Related U.S. Application Data

(63) Continuation-in-part of application No. 08/936,537, filed on Sep. 24, 1997, now abandoned.

(30) Foreign Application Priority Data

Sep. 26, 1996 (DE) .............................................. 196 39 586

(51) Int. Cl.[7] ............................. G02B 13/14; G02B 17/00
(52) U.S. Cl. ........................ 359/364; 359/357; 359/727; 359/731
(58) Field of Search ........................... 359/350, 355–361, 359/364–367, 724–732, 856–861; 355/53, 53.01, 53.1, 53.2, 55, 67

(56) References Cited

U.S. PATENT DOCUMENTS

| 3,200,253 | 8/1965 | Geier ..................................... 359/555 |
| 3,244,073 | 4/1966 | Bouwers et al. ...................... 359/727 |
| 4,714,307 | 12/1987 | Palmer ................................. 359/728 |
| 5,004,331 | 4/1991 | Haseltine et al. .................... 359/364 |
| 5,031,976 | 7/1991 | Shafer .................................. 359/355 |
| 5,114,238 | * 5/1992 | Sigler .................................. 359/357 |
| 5,323,263 | * 6/1994 | Schoenmakers ..................... 359/364 |
| 5,359,388 | * 10/1994 | Hollman ............................. 355/53.54 |
| 5,488,229 | 1/1996 | Elliott et al. ....................... 250/492.2 |

FOREIGN PATENT DOCUMENTS

| 295 16 768 U | 3/1996 | (DE) . |
| 0267766 | 5/1988 | (EP) . |
| 0396128 | 11/1990 | (EP) . |
| 0581585 | 2/1994 | (EP) . |
| 890451 | 2/1962 | (GB) .................................... 359/730 |
| 124665 | 3/1959 | (SU) .................................... 359/730 |

\* cited by examiner

*Primary Examiner*—Thong Nguyen
(74) *Attorney, Agent, or Firm*—Walter Ottesen

(57) ABSTRACT

The invention is directed to a catadioptric microlithographic reduction objective having two concave mirrors (21, 23) facing toward each other. The concave mirrors have a symmetrical configuration and a central bore. Lenses (24 to 60) are mounted downstream of the mirrors (21, 23) on the light path toward the image plane (61). Preferably, lenses (15 to 20) are moved at the object end forward into the intermediate space between the mirrors (21, 23) in the region of the central bore. The light path between the concave mirrors can then preferably be free of lenses. The formation of an intermediate image (Z) downstream of the mirrors (21, 23) affords especially good correction possibilities.

34 Claims, 2 Drawing Sheets

CATADIOPTRIC MICROLITHOGRAPHIC REDUCTION OBJECTIVE

RELATED APPLICATION

This application is a continuation-in-part application of patent application Ser. No. 08/936,537, filed Sep. 24, 1997, and entitled "Catadioptric Microlithographic Reduction Objective" now abandoned.

FIELD OF THE INVENTION

The invention relates to a catadioptric microlithographic reduction objective having two concave mirrors facing each other. Each of the concave mirrors has an axial-symmetric configuration and a central bore.

BACKGROUND OF THE INVENTION

Catadioptric reduction objectives for deep UV microlithography are known. A diagonally positioned polarizing beam splitter and a λ/4 plate are required in the embodiment disclosed in U.S. patent application Ser. No. 08/845,384, filed Apr. 25, 1997, now U.S. Pat. No. 5,800,891 and the publications cited therein. The beam splitter and the λ/4 plate present a manufacturing problem in the deep UV wavelength range. Furthermore, a deflection of the optical axis by approximately 90° is mandatory so that a second deflection is provided in order to maintain parallelism of reticle and wafer.

Other catadioptric systems are asymmetrically configured. These systems can, for example, be of the Dyson type or as shown in European patent publication 0,581,585.

U.S. Pat. No. 5,488,229 discloses a catadioptric microlithographic reduction objective which is configured to be axially symmetrical and has two concave mirrors facing toward each other. In principle, a central bore is given but this does not present a problem in view of the ever increasing significance of annular aperture illumination.

Both concave mirrors are configured as mangin mirrors and the second one of the mirrors operates in its center region as a lens. Thereafter, only the iris diaphragm and the wafer are arranged. At β=0.1, NA=0.6 and lambda—193 nm, five lenses and two mangin mirrors are sufficient. However, nothing is stated as to the image field size and as to the size of the center bore. With image field sizes, as they are obtained with the invention, mangin mirrors having a diameter up to one meter would be required. It is not seen that quartz glass or even another lens material could be made available in these dimensions in the mandatory quality for deep UV microlithography.

U.S. Pat. No. 5,031,976 discloses a similar configuration. However, the second mirror is planar and a separate thick lens is provided between the mirrors.

SUMMARY OF THE INVENTION

It is an object of the invention to provide a reduction objective which provides an image field having a size corresponding to the production requirements of wafer-stepper machines and which has a suitable error correction. With the invention, a construction is provided which facilitates manufacture and avoids especially large and thick lenses.

The catadioptric microlithographic reduction objective of the invention defines an optical axis, provides a light path and forms an image of an object. The catadioptric microlithographic reduction objective includes: two concave mirrors mounted on the optical axis facing each other; each of the concave mirrors having a configuration symmetrical to the optical axis and having a central bore; a plurality of lenses being arranged along the optical axis toward the image downstream of the mirrors on the light path; and, the concave mirrors and the plurality of lenses being configured and arranged to provide a microlithographic reduction.

Within the plurality of lenses, the light beam is again reduced to a diameter which is considerably less than the mirror diameter so that correction lenses having reasonable diameters can be utilized.

According to another feature of the invention, the lenses at the object end are positioned forward in the intermediate space between the mirrors in the region of the central bore. Thus, the object end lens system projects into the mirror intermediate space in the region of the central bore thereby positively affecting chromatic aberrations.

According to still another feature of the invention, the light path between the concave mirrors is free of lenses, that is, in the region of the largest beam diameter. Accordingly, the objective of using small lenses is achieved.

An intermediate image is provided after the mirrors. In this way, surfaces conjugated to the mirrors result in the space between the intermediate image and the image. In the vicinity of these surfaces, elements for correcting the image errors, which are caused by the mirrors, can be optimally mounted. A meniscus pair is suitable for this purpose.

According to another feature of the invention, a corrective element is provided. More specifically, a convex air lens is included between two lenses and, in this way, good correction for astigmatism is achieved.

According to other features of the invention, the image field is greater than 20 mm in diameter and the numerical aperture at the image end is greater than 0.60. Also, the field curvature is less than 0.06 μm and the chromatic correction for a bandwidth of at least 6 pm (picometer) is achieved. With these features, the advantageous quality is provided by the invention, namely, with a large image field associated with a large numeric aperture, with low image field curvature and with adequate chromatic bandwidth.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
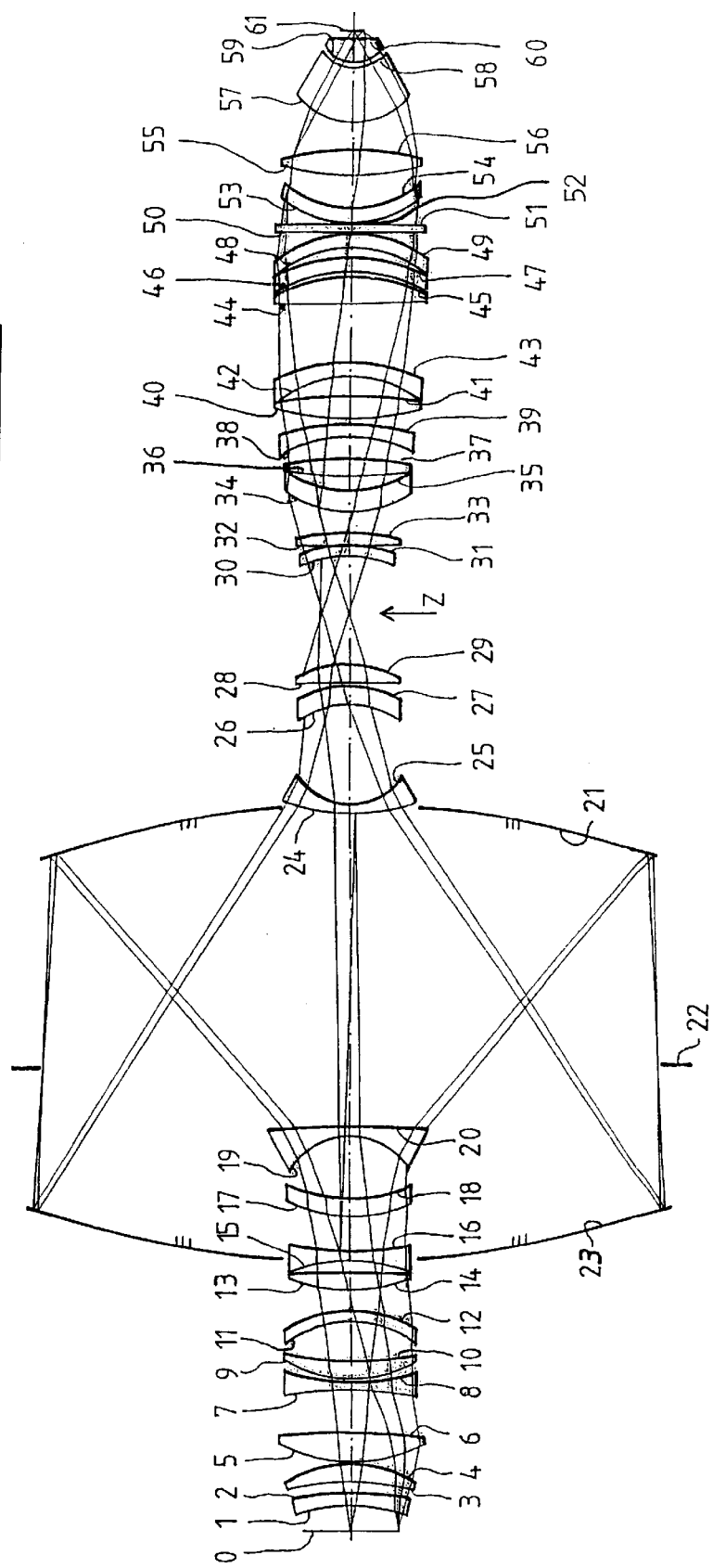
FIG. 1 is a section view taken through the lenses of the catadioptric microlithographic reduction objective according to an embodiment of the invention; and, FIG. 2 is a side elevation view, in section, of a projection exposure system according to an embodiment of the invention.

The lens section view shown in FIG. 1 together with the data in Table 1 describe the preferred embodiment of the catadioptric microlithographic reduction objective of the invention. Here, a total of 27 lenses and two mirrors (21, 23) as well as a planar plate (50/51) are shown arranged between object (O) and image plane 61. For an image field diameter of 27 mm, the diameter of the largest lens (19/20) is approximately 173 mm and the diameter of the largest mirror 23 is approximately 707 mm. As shown in FIG. 1, other lenses such as lens (17/18) have a diameter less than lens (19/20). The central bore amounts to approximately 35% of the mirror diameter. The objective is configured for the wavelength 193.38 nm and the image end numerical aperture is 0.70.

An intermediate image plane Z is realized between the surfaces 29 and 30 and meniscus lenses (46, 47; 48, 49) and (53, 54) are provided at the additional pupil P corresponding thereto. These meniscus lenses optimally correct image errors generated by the mirrors (21, 23) and especially off-axis image errors.

A planar plate (50/51) is provided between the meniscus lenses directly in the region of the pupil P. During manufacture of these objectives, this planar plate (50/51) can be used for the purpose of correcting residual errors of the objectives via small form corrections which can, for example, be generated by ion ray etching thus making a nonspherical, nonplanar surface but retaining the overall planar shape.

The object-end lens group (1 to 20) is a wide angle retrofocus objective. The lens group (24 to 29) is mirrored with respect to function to the lens group (1 to 20) and is forward of the intermediate image Z of this type. The meniscus lenses (19, 20 and 24, 25) cause the light beam to diverge greatly at the mirror end and thereby result in the small central bore. The two lens groups (1 to 20) and (24 to 29) extend into the mirror arrangement (21, 23). It is an important function of the meniscus lenses (19, 20) and (24, 25) to create a large longitudinal chromatic aberration. This aberration is compensated by all of the remaining lenses.

The greatly convex surface 57 in combination with the glass thickness of the corresponding lens up to the surface 60 is significant for the here-described objective class and is similarly conventional for microscope objectives.

All lenses are spherical and are made of quartz glass. Other materials (calcium fluoride) can be provided for the operation at lower wavelengths such as 157 nm.

The mirrors are aspherical in accordance with the known power series expansion:

$$P(h) = (1/2R)h^2 + c_1 h^4 + \ldots + c_n h^{2n+2}$$

wherein: P is the sagitta as a function of the radius h (elevation to the optical axis) with the aspheric constants $c_1$ to $c_n$ presented in Table 1. R is the vertex radius from Table 1. The deviations of the mirror surfaces from the spherical are moderate and can be controlled during manufacture.

The manufacture of such aspherical mirrors in the diameter range of 0.5 to 1 meter is known from the area of astronomic instruments. For assembly-line manufacture, shaping techniques such as galvano forming can be applied. The manufacturing accuracy does not have to be too great because conjugated corrective surfaces are available on the above-mentioned planar plate (50/51) or on one of the adjacent meniscus lens surfaces 48, 49, 53 or 54.

An optical element (50, 51) is arranged in the region of the pupil (P) following the intermediate image (Z). This optical element (50, 51) has non-spherical corrective surfaces.

It is also possible to provide elastic mirrors. As a departure from the known alignment cementing, these mirrors can be adjusted in an assembly phase utilizing actuators and can then be fixed on a rigid carrier. On the other hand, these mirrors can be controlled in optimal form during operation on line with, for example, piezoelectric actuators in order to compensate, for example, for thermal lens effects.

Figure 2:
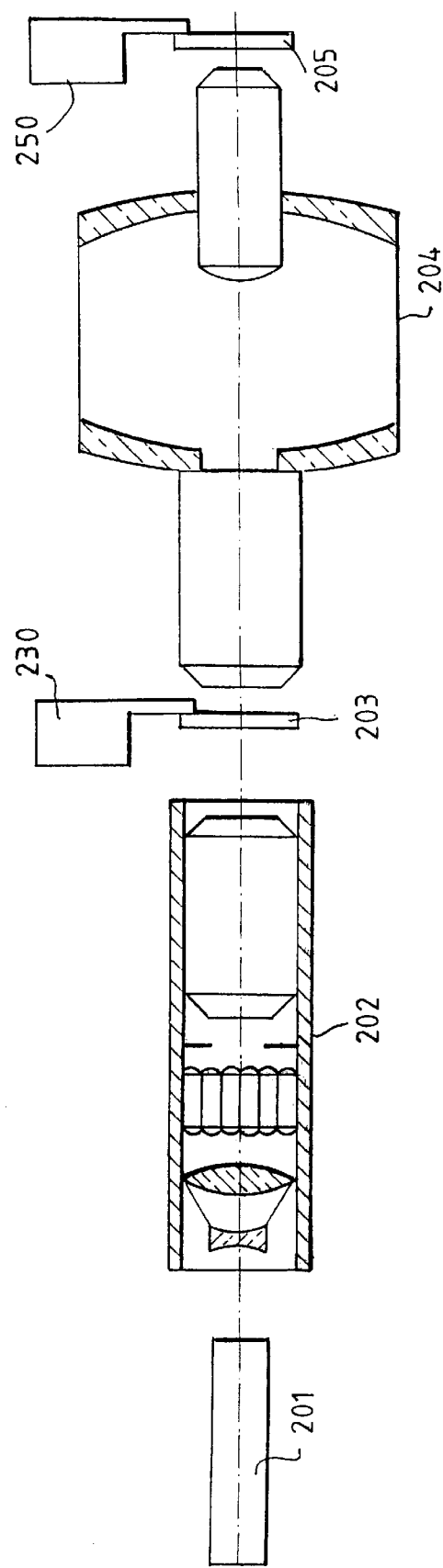

A projection exposure system is shown in FIG. 2 and includes a light source 201, for example, an excimer laser emitting light at a wavelength below 250 nm. An illumination system 202 is arranged downstream of the light source 201. Reference numeral 230 identifies the mask holder and operating system. The mask holder holds a mask 203 on the optical axis downstream of the illumination system 202 as shown. A catadioptric reduction objective 204 follows the mask holder and operating system 230 and can, for example, correspond to the catadioptric microlithographic reduction objective shown in FIG. 1. The reduction objective 204 has a reduction ratio in the range of 1:2 to 1:10.

The object is identified by reference numeral 205 and can be, for example, a semiconductor wafer or LCD panel. The object 205 is held by an object holder and operating system 250.

It is understood that the foregoing description is that of the preferred embodiments of the invention and that various changes and modifications may be made thereto without departing from the spirit and scope of the invention as defined in the appended claims.

TABLE 1

| SF | RADII | | THICKNESSES | GLASSES |
|---|---|---|---|---|
| 0 | Object | | | |
| 1 | −152.31391 | | 9.3670 | SUPRA1 |
| 2 | −934.28326 | | 17.0479 | |
| 3 | −258.50662 | | 17.9979 | SUPRA1 |
| 4 | −144.13579 | | 1.5242 | |
| 5 | 154.21865 | | 34.9172 | SUPRA1 |
| 6 | −1044.16454 | | 50.7402 | |
| 7 | −368.80081 | | 10.1606 | SUPRA1 |
| 8 | 238.39923 | | 2.8591 | |
| 9 | 138.64466 | | 18.7404 | SUPRA1 |
| 10 | 312.00878 | | 44.3518 | |
| 11 | −122.26492 | | 12.8011 | SUPRA1 |
| 12 | −126.81758 | | 23.6934 | |
| 13 | 177.47680 | | 19.3377 | SUPRA1 |
| 14 | 11788.39412 | | 15.9136 | |
| 15 | −172.90112 | | 7.5815 | SUPRA1 |
| 16 | 295.02570 | | 40.3349 | |
| 17 | 149.52872 | | 16.3659 | SUPRA1 |
| 18 | 134.69462 | | 72.7792 | |
| 19 | −79.93868 | | 10.3887 | SUPRA1 |
| 20 | −1129.04446 | | 361.0000 | |
| 21 | −981.42317 | AS | −295.0000 | |
| 22 | Infinity | | −215.0000 | |
| | Diaphragm | | .0000 | |
| 23 | 1113.03904 | AS | 500.6296 | |
| 24 | 226.60310 | | 8.2622 | SUPRA1 |
| 25 | 68.17289 | | 114.8808 | |
| 26 | −91.66030 | | 20.9850 | SUPRA1 |
| 27 | −111.26948 | | 4.2440 | |
| 28 | −1008.42184 | | 16.6387 | SUPRA1 |
| 29 | −119.24333 | | 127.0374 | |
| 30 | −105.29899 | | 8.7290 | SUPRA1 |
| 31 | −151.29067 | | .0532 | |
| 32 | 6408.14692 | | 13.0429 | SUPRA1 |
| 33 | −304.40400 | | 26.5391 | |
| 34 | 115.05002 | | 19.9112 | SUPRA1 |
| 35 | 113.02003 | | 18.2856 | |
| 36 | 480.50139 | | 16.6611 | SUPRA1 |
| 37 | −425.21265 | | 25.4688 | |
| 38 | −154.46333 | | 14.1991 | SUPRA1 |
| 39 | −240.64362 | | 8.7927 | |
| 40 | 289.04838 | | 24.5556 | SUPRA1 |
| 41 | −469.53160 | | 22.0894 | |
| 42 | −127.91442 | | 14.2424 | SUPRA1 |
| 43 | −179.26273 | | 67.4834 | |
| 44 | 4904.05552 | | 29.6764 | SUPRA1 |
| 45 | −179.72857 | | 8.1164 | |
| 46 | −152.96898 | | 13.7764 | SUPRA1 |
| 47 | −203.54702 | | 12.9619 | |
| 48 | −127.62811 | | 14.1864 | SUPRA1 |
| 49 | −139.16594 | | .4118 | |
| 50 | Infinity | | 8.0000 | SUPRA1 |
| 51 | Infinity | | 4.0000 | |
| 52 | Infinity | | .0001 | |
| 53 | 121.70233 | | 15.3662 | SUPRA1 |

TABLE 1-continued

| SF | RADII | THICKNESSES | GLASSES |
|---|---|---|---|
| 54 | 109.92284 | 36.1371 | |
| 55 | 219.24113 | 30.1687 | SUPRA1 |
| 56 | −303.41760 | 31.5237 | |
| 57 | 73.58279 | 65.3446 | SUPRA1 |
| 58 | 43.81552 | 3.1551 | |
| 59 | 41.37557 | 28.5961 | SUPRA1 |
| 60 | 604.77330 | .6625 | |
| 61 | Image Plane | | |

Asphere on Surface 21
C 1 = −.1984860500E − 10
C 2 = −.8471592100E − 16
C 3 = −.1338734300E − 21
C 4 = .1383973100E − 27
C 5 = .1716228700E − 32
C 6 = .4845464500E − 38
C 7 = −.3305365300E − 44
Asphere on Surface 23
C 1 = .1686460500E − 10
C 2 = −.4430448700E − 16
C 3 = −.1503908600E − 21
C 4 = .2530123600E − 27
C 5 = −.7105016500E − 35
C 6 = −.2345880200E − 38
C 7 = .3712453500E − 43
SUPRA1 = Quartz Glass

What is claimed is:

1. A catadioptric microlithographic reduction objective defining an optical axis, providing a light path and forming an image of an object, the catadioptric microlithographic reduction objective comprising:

two concave mirrors mounted on said optical axis facing each other;

each of said concave mirrors having a configuration symmetrical to the optical axis and having a central bore;

a plurality of lenses being arranged along said optical axis toward said image downstream of said concave mirrors on said light path;

said concave mirrors conjointly defining an intermediate space therebetween; said plurality of lenses being a first plurality of lenses;

said reduction objective further including a second plurality of lenses arranged on said optical axis upstream of said first plurality of lenses and facing toward said object;

said second plurality of lenses extending at least partially into said intermediate space;

said second plurality of lenses, said concave mirrors and a portion of said first plurality of lenses conjointly forming an intermediate image (Z) of said object on said optical axis downstream of said concave mirrors; and, two lenses of said first plurality conjointly defining a convex air lens therebetween downstream of said intermediate image.

2. The catadioptric microlithographic reduction objective of claim 1, wherein said light path between said concave mirrors is devoid of lenses.

3. The catadioptric microlithographic reduction objective of claim 1, wherein all of said lenses are made of the same material.

4. A catadioptric microlithographic reduction objective defining an optical axis, providing a light path and forming an image of an object, the catadioptric microlithographic reduction objective comprising:

two concave mirrors mounted on said optical axis facing each other;

each of said concave mirrors having a configuration symmetrical to the optical axis and having a central bore;

a plurality of lenses being arranged along said optical axis toward said image downstream of said concave mirrors on said light path;

a portion of said lenses and said concave mirrors forming an intermediate image (Z) on said optical axis downstream of said concave mirrors;

a pupil (P) being formed downstream of said intermediate image (Z); and, said plurality of lenses including meniscus lenses being mounted in a region near said pupil (P) and said meniscus lenses being convex toward said pupil.

5. The catadioptric microlithographic reduction objective of claim 4, said plurality of lenses including an optical element mounted in said region; and, said optical element having nonspherical corrective surfaces.

6. The catadioptric microlithographic reduction objective of claim 4, wherein said light path between said concave mirrors is devoid of lenses.

7. The catadioptric microlithographic reduction objective of claim 4, wherein all of said lenses are made of the same material.

8. A catadioptric microlithographic reduction objective defining an optical axis, providing a light path and forming an image of an object, the catadioptric microlithographic reduction objective comprising:

two concave mirrors mounted on said optical axis facing each other;

each of said concave mirrors having a configuration symmetrical to the optical axis and having a central bore;

a first plurality of lenses being arranged along said optical axis toward said image downstream of said concave mirrors on said light path;

a second plurality of lenses arranged on said optical axis upstream of said first plurality of lenses and facing toward said object; and, said second plurality of lenses, said concave mirrors and a portion of said first plurality of lenses conjointly forming an intermediate image (Z) of said object on said optical axis downstream of said concave mirrors.

9. The catadioptric microlithographic reduction objective of claim 8, wherein said light path between said concave mirrors is devoid of lenses.

10. The catadioptric microlithographic reduction objective of claim 9, wherein each of said lenses of said first plurality and of said second plurality has a diameter and wherein the largest diameter of said diameters is about 173 mm.

11. The catadioptric microlithographic reduction objective of claim 8, wherein said objective has an image end numerical aperture greater than 0.60.

12. The catadioptric microlithographic reduction objective of claim 11, wherein said reduction objective defines an image field having a diameter greater than 20 mm.

13. The catadioptric microlithographic reduction objective of claim 12, wherein said objective has an image field curvature less than 0.06 $\mu$m.

14. The catadioptric microlithographic reduction objective of claim 8, wherein a chromatic correction for a bandwidth of at least 6 pm is obtained.

15. The catadioptric microlithographic reduction objective of claim 8, wherein all of said lenses are made of the same material.

16. The catadioptric microlithographic reduction objective of claim 15, wherein said material is quartz glass.

17. The catadioptric microlithographic reduction objective of claim 15, wherein said material is a fluoride crystal.

18. The catadioptric microlithographic reduction objective of claim 8, said first plurality of lenses including a diverging lens for reducing the central bore of one of said concave mirrors to a maximum of approximately 35% of the diameter of said one concave mirror; and, said second plurality of lenses including a diverging lens for reducing the central bore of the other one of said concave mirrors to a maximum of approximately 35% of the diameter of said other one of said concave mirrors.

19. A catadioptric microlithographic reduction objective defining an optical axis, providing a light path and forming an image of an object, the catadioptric microlithographic reduction objective comprising:
  two concave mirrors mounted on said optical axis facing each other;
  each of said concave mirrors having a configuration symmetrical to the optical axis and having a central bore;
  a first plurality of lenses being arranged along said optical axis toward said image downstream of said concave mirrors on said light path;
  said concave mirrors conjointly defining an intermediate space therebetween; and,
  a second plurality of lenses arranged on said optical axis upstream of said first plurality of lenses and facing toward said object; and, only said second plurality of lenses extending at least partially into said intermediate space.

20. The catadioptric microlithographic reduction objective of claim 9, wherein said object has an object field and wherein said object field is centered on the optical axis.

21. The catadioptric microlithographic reduction objective of claim 19, wherein said light path between said concave mirrors is devoid of lenses.

22. The catadioptric microlithographic reduction objective of claim 21, wherein each of said lenses of said first plurality and of said second plurality has a diameter and wherein the largest diameter of said diameters is about 173 mm.

23. The catadioptric microlithographic reduction objective of claim 19, wherein said objective has an image end numerical aperture greater than 0.60.

24. The catadioptric microlithographic reduction objective of claim 23, wherein said reduction objective defines an image field having a diameter greater than 20 mm and said objective has an image field curvature less than 0.06 $\mu$m.

25. The catadioptric microlithographic reduction objective of claim 19, wherein a chromatic correction for a bandwidth of at least 6 pm is obtained.

26. The catadioptric microlithographic reduction objective of claim 19, wherein all of said lenses are made of the same material.

27. The catadioptric microlithographic reduction objective of claim 26, wherein said material is quartz glass.

28. The catadioptric microlithographic reduction objective of claim 26, wherein said material is a fluoride crystal.

29. The catadioptric microlithographic reduction objective of claim 19, said first plurality of lenses including a diverging lens for reducing the central bore of one of said concave mirrors to a maximum of approximately 35% of the diameter of said one concave mirror; and, said second plurality of lenses including a diverging lens for reducing the central bore of the other one of said concave mirrors to a maximum of approximately 35% of the diameter of said other one of said concave mirrors.

30. A catadioptric microlithographic reduction objective defining an optical axis, providing a light path and forming an image of an object, the catadioptric microlithographic reduction objective comprising:
  two concave mirrors mounted on said optical axis facing each other;
  each of said concave mirrors having a configuration is symmetrical to the optical axis and having a central bore;
  a first plurality of lenses being arranged along said optical axis toward said image downstream of said concave mirrors on said light path;
  said concave mirrors conjointly defining an intermediate space therebetween;
  a second plurality of lenses arranged on said optical axis upstream of said first plurality of lenses and facing toward said object; and, only said second plurality of lenses extending at least partially into said intermediate space; and,
  said second plurality of lenses, said concave mirrors and a portion of said first plurality of lenses conjointly forming an intermediate image (Z) of said object on said optical axis downstream of said concave mirrors.

31. The catadioptric microlithographic reduction objective of claim 30, wherein said light path between said concave mirrors is devoid of lenses.

32. The catadioptric microlithographic reduction objective of claim 30, wherein all of said lenses are made of the same material.

33. A projection exposure system comprising:
  a light source emitting light at a wavelength below 250 nm;
  an illumination system arranged downstream of said light source;
  a mask holder and operating system;
  a catadioptric reduction objective;
  an object holder and operating system;
  said catadioptric reduction objective defining an optical axis, providing a light path and forming an image of the object; and,
  said catadioptric reduction objective including:
    two concave mirrors mounted on said optical axis facing each other;
    each of said concave mirrors having a configuration symmetrical to the optical axis and having a central bore;
    a plurality of lenses arranged along said optical axis toward said image downstream of said concave mirrors on said light path;
    a portion of said lenses and said concave mirrors conjointly forming an intermediate image (Z) on said optical axis downstream of said concave mirrors;
    a pupil (P) being formed downstream of said intermediate image (Z); and,
    said plurality of lenses including meniscus lenses being mounted in a region near said pupil (P) and said meniscus lenses being convex toward said pupil.

34. A projection exposure system comprising:
  a light source emitting light at a wavelength below 250 nm;

an illumination system arranged downstream of said light source;

a mask holder and operating system;

a catadioptric reduction objective;

an object holder and operating system;

said catadioptric reduction objective defining an optical axis, providing a light path and forming an image of the object; and, said catadioptric reduction objective including: two concave mirrors mounted on said optical axis facing each other;

each of said concave mirrors having a configuration symmetrical to the optical axis and having a central bore;

a plurality of lenses being arranged along said optical axis toward said image downstream of said concave mirrors on said light path;

said concave mirrors conjointly defining an intermediate space therebetween; said plurality of lenses being a first plurality of lenses;

said reduction objective further including a second plurality of lenses arranged on said optical axis upstream of said first plurality of lenses and facing toward said object;

said second plurality of lenses extending at least partially into said intermediate space;

an intermediate image (Z) being formed on said optical axis downstream of said concave mirrors; and, two lenses of said first plurality conjointly defining a convex air lens therebetween downstream of said intermediate image.

* * * * *

UNITED STATES PATENT AND TRADEMARK OFFICE
CERTIFICATE OF CORRECTION

PATENT NO. : 6,169,627 B1
DATED : January 2, 2001
INVENTOR(S) : Karl Heinz Schuster It is certified that error appears in the above-identified patent and that said Letters Patent is hereby corrected as shown below:

<u>Column 7,</u>
Line 38, delete "9" and substitute -- 19 -- therefor.

<u>Column 8,</u>
Line 13, delete "is".

Signed and Sealed this

Sixth Day of August, 2002

Attest:

JAMES E. ROGAN
Attesting Officer     Director of the United States Patent and Trademark Office